(12) United States Patent
Shirai et al.

(10) Patent No.: US 10,910,783 B2
(45) Date of Patent: Feb. 2, 2021

(54) CIRCUIT MODULE AND METHOD FOR MANUFACTURING CIRCUIT MODULE

(71) Applicant: Yazaki Corporation, Tokyo (JP)

(72) Inventors: Mizuki Shirai, Shizuoka (JP); Toshiharu Shimizu, Shizuoka (JP); Hiroki Kondo, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/836,990

(22) Filed: Apr. 1, 2020

(65) Prior Publication Data
US 2020/0343678 A1    Oct. 29, 2020

(30) Foreign Application Priority Data

Apr. 23, 2019 (JP) .................. 2019-082138

(51) Int. Cl.
| | |
|---|---|
| *H01R 12/53* | (2011.01) |
| *H01R 43/02* | (2006.01) |
| *H05K 1/11* | (2006.01) |
| *H05K 3/32* | (2006.01) |
| *H01R 9/05* | (2006.01) |
| *H05K 1/02* | (2006.01) |

(52) U.S. Cl.
CPC ....... *H01R 43/0256* (2013.01); *H01R 9/0515* (2013.01); *H01R 12/53* (2013.01); *H05K 1/025* (2013.01); *H05K 1/0219* (2013.01); *H05K 1/117* (2013.01); *H05K 3/32* (2013.01); *H05K 2201/10356* (2013.01)

(58) Field of Classification Search
CPC ........ H01R 12/53; H01R 9/0515–0518; H01R 43/0256; H01R 24/50; H01R 4/04; H05K 1/0243; H05K 3/3405; H05K 2201/09809; H05K 2201/09145; H05K 2201/10356; H05K 1/0237; H05K 1/025; H05K 1/117; H05K 3/32; H05K 1/0219; H05K 2201/0919; H05K 2201/09618; Y10T 29/49147
USPC .............................. 174/250, 71 C, 75 C, 361
See application file for complete search history.

(56) References Cited

U.S. PATENT DOCUMENTS

| | | | | |
|---|---|---|---|---|
| 3,934,783 A | * | 1/1976 | Larrison | B23K 20/005 228/110.1 |
| 4,415,115 A | * | 11/1983 | James | H01L 24/48 228/170 |
| 4,656,441 A | * | 4/1987 | Takahashi | H01P 5/085 333/260 |

(Continued)

FOREIGN PATENT DOCUMENTS

| | | |
|---|---|---|
| JP | 2009-218085 A | 9/2009 |
| JP | 2018-63894 A | 4/2018 |

*Primary Examiner* — Steven T Sawyer
(74) *Attorney, Agent, or Firm* — Kenealy Vaidya LLP

(57) ABSTRACT

An inner conductor of a coaxial cable is electrically connected to a circuit body of a circuit board by means of solder. An outer conductor is electrically connected to a ground body by means of the solder. The inner conductor has a connecting portion connected to the circuit body and a non-exposed portion inside a sheath. A thickness of the connecting portion is equal to or less than 35% of a thickness of the non-exposed portion, and the cross-sectional area of the connecting portion is the same as the cross-sectional area of the non-exposed portion.

10 Claims, 6 Drawing Sheets

(56) References Cited

U.S. PATENT DOCUMENTS

| | | | | |
|---|---|---|---|---|
| 5,378,857 A | * | 1/1995 | Swailes | H05K 1/111 |
| | | | | 174/251 |
| 5,797,765 A | * | 8/1998 | Barnett | H01R 24/50 |
| | | | | 333/260 |
| 6,007,347 A | * | 12/1999 | Keldsen | H01R 9/0515 |
| | | | | 439/581 |
| 6,154,103 A | * | 11/2000 | Scharen | H01P 1/04 |
| | | | | 333/260 |
| 2002/0115314 A1 | * | 8/2002 | Carson | H01R 9/0515 |
| | | | | 439/67 |
| 2007/0181337 A1 | * | 8/2007 | Miller | H05K 1/0243 |
| | | | | 174/261 |
| 2010/0200969 A1 | * | 8/2010 | Huang | H01L 24/85 |
| | | | | 257/666 |
| 2013/0313003 A1 | * | 11/2013 | Okayama | H05K 1/025 |
| | | | | 174/251 |

* cited by examiner

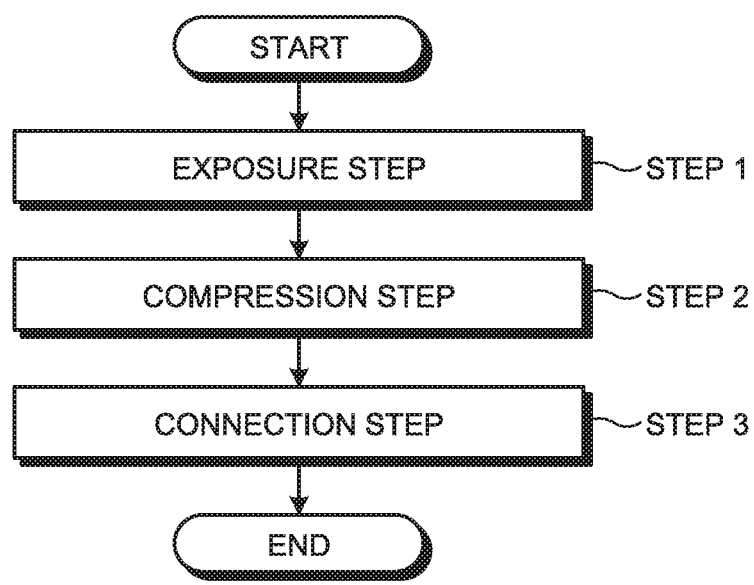

FIG.5
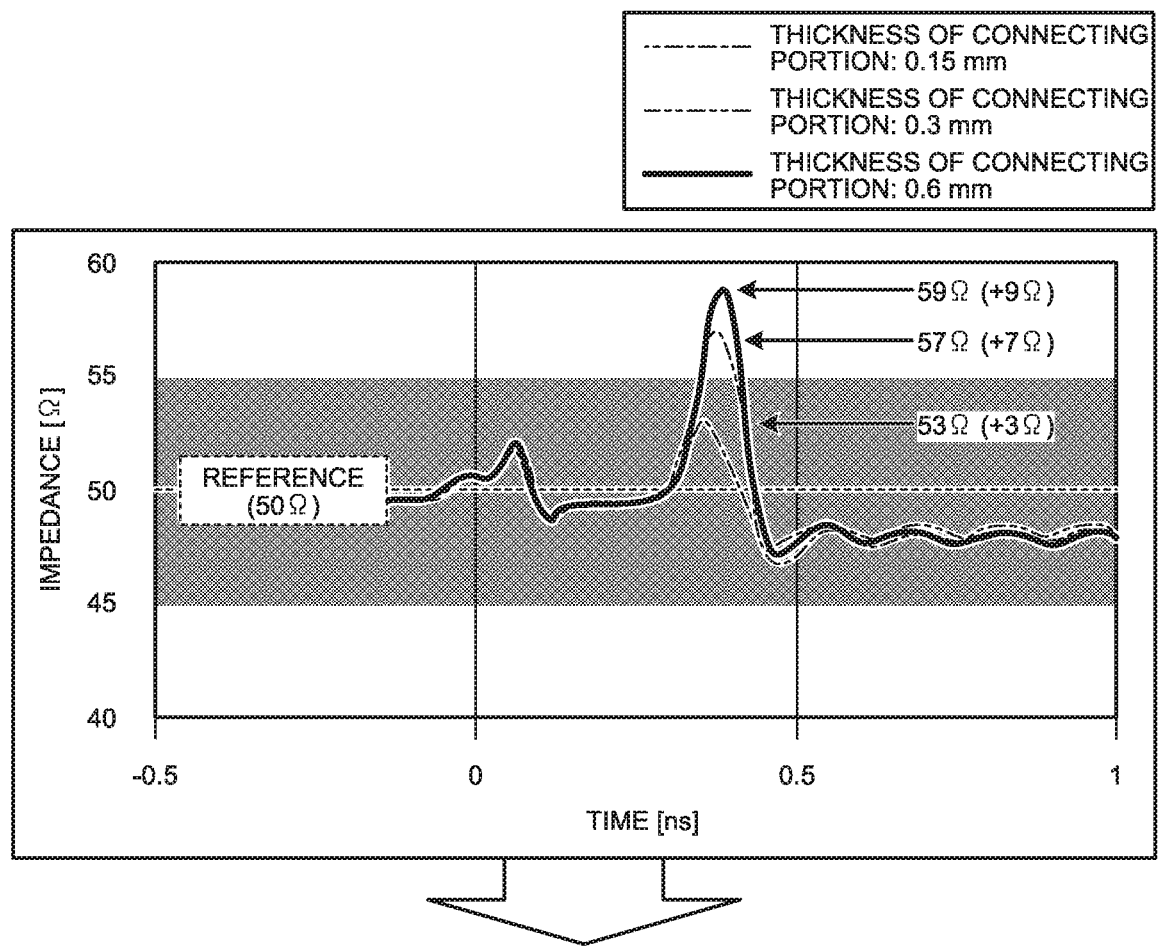
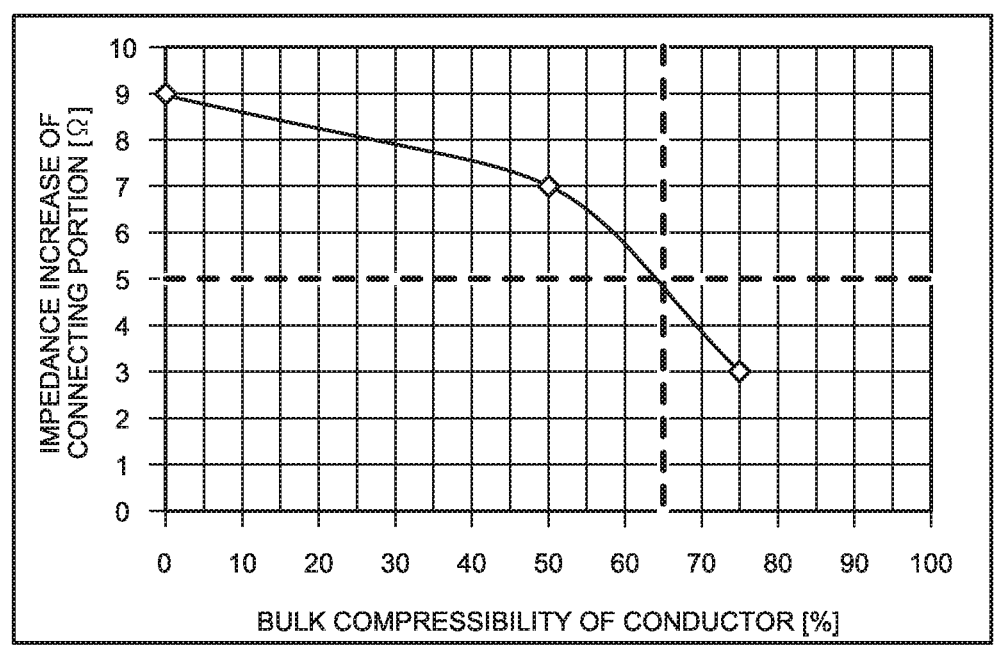

CIRCUIT MODULE AND METHOD FOR MANUFACTURING CIRCUIT MODULE

CROSS-REFERENCE TO RELATED APPLICATION(S)

The present application claims priority to and incorporates by reference the entire contents of Japanese Patent Application No. 2019-082138 filed in Japan on Apr. 23, 2019.

BACKGROUND OF THE INVENTION

1. Field of the Invention

The present invention relates to a circuit module and a method for manufacturing the circuit module.

2. Description of the Related Art

Conventionally, as a technique for connecting a coaxial cable to a circuit board, Japanese Patent Application. Laid-open No. 2009-218085 discloses maintaining impedance matching by using an adapter 10 to connect a high-frequency cable 20 to wiring 32 of a PUB 30, for example.

Furthermore, Japanese Patent Application Laid-open No. 2018-63894 discloses matching impedance easily by using a coaxial connector 10 to connect a coaxial cable Cb to a printed circuit board 9q.

However, in the case of the foregoing connection techniques disclosed in J Japanese Patent Application Laid-open open No. 2009-218085 and Japanese Patent Application Laid-open No. 2018-63894 described above, although as impedance mismatch is suppressed by using the adapter 10 or the coaxial connector 10, a component such as the adapter 10 or the coaxial connector 10 is required in order to suppress an impedance mismatch.

SUMMARY OF THE INVENTION

The present invention was conceived in view of the foregoing, and the purpose of the present invention is to provide a circuit module and a method for manufacturing the circuit module that enable suppression of an impedance mismatch without using a component for suppressing the impedance mismatch.

In order to achieve the above mentioned object, a circuit module in which as inner conductor of a coaxial cable is connected by means of a solder to a circuit body of a circuit board according to one aspect of the present invention includes the circuit board including: a dielectric body; the circuit body formed on a surface of the dielectric body; and a ground body formed on a back face of the dielectric body, and the coaxial cable including: the inner conductor; an insulator provided to surround the inner conductor; an outer conductor provided to surround the insulator; and a sheath provided to surround the outer conductor, wherein the inner conductor has a connecting portion connected to the circuit body, and a non-exposed portion inside the sheath, and a thickness of the connecting portion is equal to or less than 35% of a thickness of the non-exposed portion and the cross-sectional area of the connecting portion is the same as the cross-sectional area of the non-exposed portion.

In order to achieve the above mentioned object, a method for manufacturing a circuit module in which an inner conductor of a coaxial cable is connected by means of a solder to a circuit body of a circuit board according to another aspect of the present invention includes the circuit board including: a dielectric body, the circuit body formed on a surface of the dielectric body, and a ground body formed on a back face of the dielectric body, and the coaxial cable including: the inner conductor, an insulator provided to surround the inner conductor, an outer conductor provided to surround the insulator, and a sheath provided to surround the outer conductor, the inner conductor having a connecting portion connected to the circuit body, and a non-exposed portion inside the sheath, the method including: an exposure step in which the insulator, the outer conductor and the sheath of the coaxial cable are stripped away to expose the connecting portion to the outside; a compression step in which compression is performed to render a thickness of the connecting portion equal to or less than 35% of a thickness of the non-exposed portion and to make the cross-sectional area of the connecting portion the same as the cross-sectional area of the non-exposed portion; and a connection step in which the connecting portion is connected by means of the solder to the circuit body.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 2 is a flowchart illustrating an overview of a method for manufacturing the circuit module;

FIG. 5 is a diagram illustrating the results of measuring the impedance of the circuit module.

DETAILED DESCRIPTION OF THE PREFERRED EMBODIMENTS

An embodiment of a circuit module and a method for manufacturing the circuit module according to the present invention will be described in detail hereinbelow with reference to the drawings. Note that the present invention is not limited to or by the present embodiment. Furthermore, the constituent elements of the following embodiment include constituent elements that could easily be conceived by a person skilled in the art or which are substantially the same. Moreover, various omissions, substitutions and modifications can be made to the constituent elements of the following embodiment without departing from the spirit of the invention.

Figure 1A:
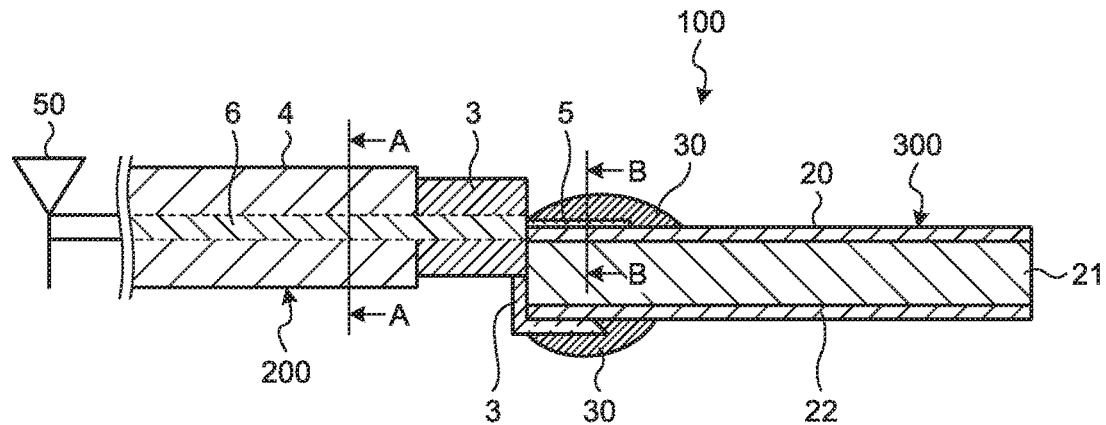
FIG. 1A is a schematic diagram illustrating a circuit module in which an inner conductor of a coaxial cable is connected to a circuit body of a circuit board.
Figure 1B:
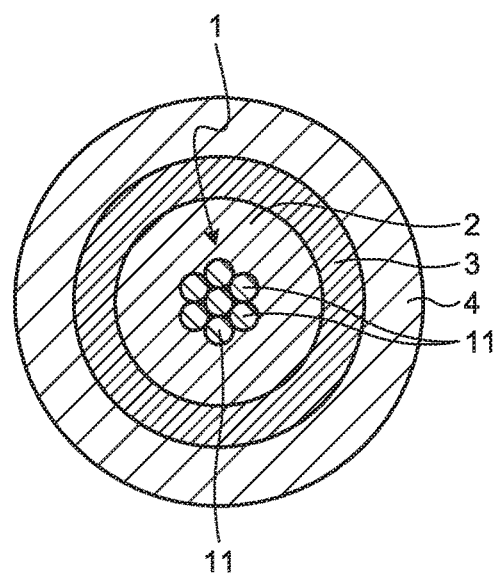
FIG. 1B is a cross-sectional view along A-A in FIG. 1A.
Figure 1C:
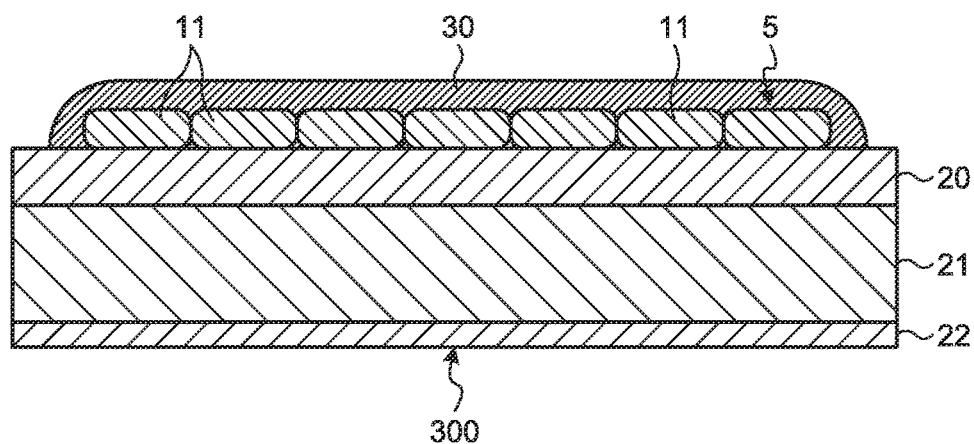
FIG. 1C is a cross-sectional view along B-B of FIG. 1A.

FIG. 1A a schematic diagram illustrating a circuit module 100 in which an inner conductor 1 of a coaxial cable 200 is connected to a circuit body 20 of a circuit board 300. FIG. 1B is a cross-sectional view along A-A in FIG. 1A. Further, FIG. 1C is a cross-sectional view along B-B in FIG. 1A. The circuit module 100 according to the present embodiment includes a coaxial cable 200 that transmits a radio wave signal received by an antenna 50, and a circuit board 300 that is built into a vehicle-mounted device. The configuration is such that the radio wave signal received by the antenna 50 is relayed by the coaxial cable 200 and transmitted to the circuit board 300 of the vehicle-mounted device. According to the present embodiment, the vicinity of the terminal of the coaxial cable 200 is stripped away, exposing an outer conductor 3 and the inner conductor 1 to the outside of the coaxial cable 200, and the exposed inner conductor 1 is electrically connected by means of solder to the circuit body 20 of the circuit board 300 and the exposed outer conductor 3 is electrically connected by means of solder 30 to a ground body 22 of the circuit board 300. Note that the stripping method is performed by sequentially carrying out stripping treatments that include cutting and stripping by means of laser irradiation and cutting work, or the like, for example.

A method of electrically connecting the inner conductor 1 of the coaxial cable 200 to the circuit body 20 of the circuit board 300 by means of the solder 30 is performed by disposing the inner conductor 1 of the coaxial cable 200 on the circuit body 20 formed on a surface of a dielectric body 21 of the circuit board 300, and then performing soldering, for example.

A method of electrically connecting the outer conductor 3 of the coaxial cable 200 to the ground body 22 of the circuit board 300 by means of the solder 30 is performed by twisting together, into a single cable, braids which are the outer conductor 3 of the coaxial cable 200, subsequently disposing the stranded single cable on the ground body 22 formed on the back face of the dielectric body 21, and then performing soldering, for example.

As illustrated in FIGS. 1 and 2, the coaxial cable 200 is provided with the inner conductor 1, an insulator 2 that covers the outer circumference of the inner conductor 1, the outer conductor 3 that covers the outer circumference of the insulator 2, and a sheath 4 that covers the outer circumference of the outer conductor 3. The coaxial cable 200 is formed, from the center toward the outside in a radial direction, by the inner conductor 1, the insulator 2, the outer conductor 3, and the sheath 4 in that order. The coaxial cable 200 according to the present embodiment has an impedance of 50Ω.

The inner conductor 1 transmits electrical power, signals, and the like, and is configured, in the present embodiment, from a stranded cable made by twisting together seven metal wires with a wire diameter of 0.18±0.008 mm. Soft copper is used as the material of the metal Note that tin-plated soft copper, a copper alloy, aluminum, or an aluminum alloy, or the like, for example, may also be used. Furthermore, the inner conductor 1 has a part which is inside the sheath 4 as a non-exposed portion 6. Within the inner conductor 1, the cross section of the non-exposed portion 6 is formed with a circular shape.

Figure 3:
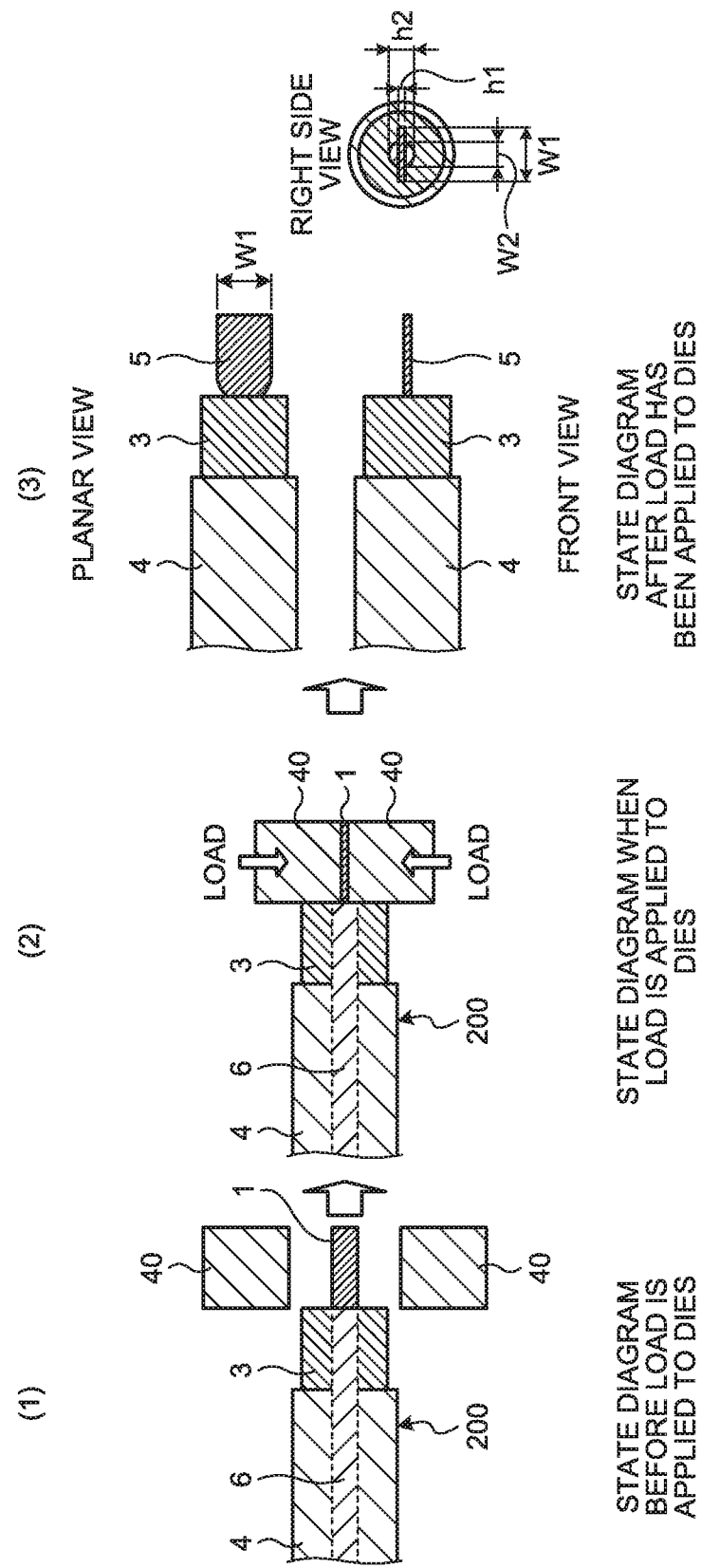
FIG. 3 is a cross-sectional view illustrating press working of the inner conductor of the coaxial cable.

The inner conductor 1 has a connecting portion 5 for connecting to the circuit body 20 of the circuit board 300. The connecting portion 5 is exposed to the outside of the coaxial cable 200 and, as illustrated in FIGS. 1 to 3, is formed with a rectangular cross section. As illustrated in FIG. 3, the connecting portion 5 is formed with a thickness h1 equal to or less than 35% of a thickness h2 of the non-exposed portion 6. Furthermore, the connecting portion 5 is formed with a cross-sectional area which is the same as the cross-sectional area of the part of the inner conductor 1 which is inside the sheath 4, that is, the non-exposed portion 6. The thickness h1 of the connecting portion is preferably set at 30% to 35% of the thickness h2 of the non-exposed portion 6 due to the concern about the strength of the connecting portion 5 degrading when a load acts on the connecting portion 5 in the event of excessive compression. For the connecting portion 5 according to the present embodiment, the thickness h1 is 25% of h2.

The insulator 2 is disposed on the outer circumferential face of the inner conductor 1 and is stacked on the outer side in a radial direction from the outer circumferential face of the inner conductor 1. In order that the impedance of the coaxial cable 200 be set at 50Ω, the insulator 2 is made of cross-linked polyethylene and has a thickness of 0.555 mm. Note that, for the insulator 2, a synthetic resin such as a thermoplastic elastomer or another rubber-like elastic body, a foam insulator obtained by foaming a polyethylene resin or another synthetic resin, or a rubber-like elastic body, may be used.

The outer conductor is disposed on the outer circumferential face of the insulator 2 and is stacked on the outer side in a radial direction from the outer circumferential face of the insulator 2. The outer conductor 3 is configured from a braid made by braiding metal wires with a wire diameter of 0.10 mm into a braid. Note that either a metallic foil or both a metallic foil and a braid may be used, for example. Tin-plated soft copper is used as the material of the metal wires. Note that soft copper, a copper alloy, aluminum, or an aluminum alloy, or the like, for example, may also be used. Braids of the outer conductor 3 are twisted together into a single wire which is electrically connected by means of the solder 30 to the ground body 22 of the circuit board 300. By twisting together braids into a single wire which is electrically connected by means of the solder 30 to the ground body 22 of the circuit board 300, a ground connection can be implemented Without using a terminal or other such member.

The sheath 4 is disposed on the outer circumferential face of the outer conductor 3 and is stacked on the outer side in a radial direction from the outer circumferential face of the outer conductor 3. Polyvinyl chloride (PVC) is used for the sheath 4, which is afforded a thickness of 0.455 mm. Note that PE or PP, or the like, may also be used.

The antenna 50 receives radio waves from the outside. The antenna 50 is provided with a plurality of electronic components such as an amplifier and a filter. The antenna 50 is electrically connected to the circuit board 300 by means of the coaxial cable 200.

The circuit board 300 is a processing circuit for displaying a signal received from the antenna 50, on a car navigation system, or the like. The circuit board 300 has the circuit body 20 which is formed so as to sandwich the dielectric body 21.

The circuit board 300 is configured from a dielectric body 21 (a PET film, for example) of a predetermined thickness (750 μm), a circuit body 20 formed on a surface of the dielectric body 21, a ground body (not illustrated) on both sides of the circuit body 20, and a ground body 22 formed on the back face of the dielectric body 21. Note that the circuit body 20 and the ground body 22 have a thickness on the order of 18 μm.

A method for manufacturing the circuit module 100 will be described next. FIG. 2 is a flow chart illustrating an overview of a method for manufacturing the circuit module. According to the method for manufacturing the circuit module 100, a circuit module is manufactured by means of an exposure step (step 1), a compression step (step 2), and a connection step (step 3), as illustrated in FIG. 2.

In the exposure step (step 1), in the vicinity of the terminal of the coaxial cable 200, a coaxial cable stripper, for example, is used to remove the insulator 2, the outer conductor 3, and the sheath 4 such that the inner conductor 1 for connecting to the circuit body 20 of the circuit board 300 is exposed to the outside.

In the compression step (step 2), compression is performed to render the thickness h1 of the connecting portion 5 equal to or less than 35% of the thickness h2 of the non-exposed portion 6 and to make the cross-sectional area of the connecting portion 5 the same as the cross-sectional area of the non-exposed portion 6.

Here, the compression step (step 2), that is, the method for compressing the inner conductor 1 of the coaxial cable 200 will be described. FIG. 3 is a cross-sectional view illustrating press working of the inner conductor of the coaxial cable. Here, in FIG. 3, (1) is a state diagram before a load is applied to dies, (2) is a state diagram when a load is applied to the dies, and (3) is a state diagram after a load has been applied to the dies.

First, within the inner conductor 1, the part exposed to the outside is disposed between a pair of dies 40 ((1) in FIG. 3). Next, the dies 40 are moved in a direction toward each other, and by applying a load to the part of the inner conductor 1 which is exposed to the outside, the part of the inner conductor 1 which is exposed to the outside is subjected to compression forming ((2) in FIG. 3). By subjecting the part of the inner conductor 1 which is exposed to the outside to compression forming, this part is molded as the connecting portion 5, which is for a connection to the circuit body 20 of the circuit board 300 ((3) in FIG. 3). Here, because the connecting portion 5 is subjected to compression forming by the dies 40, the connecting portion 5 has a width w2 which is wider than a width w1 of the non-exposed portion 6 and has a cross-sectional area which is the same as the cross-sectional area of the non-exposed portion 6.

In the connection step (step 3), the connecting portion 5 is disposed opposite the circuit body 20 of the circuit board 300 and then connected using the solder 30, as illustrated in FIG. 2. Furthermore, after the braids, which are the outer conductor 3, have been twisted together into a single wire, the terminal of the outer conductor 3 resulting from this single wire is disposed opposite the ground body 22 and then connected using the solder 30. The circuit module 100 is manufactured accordingly.

Figure 4:
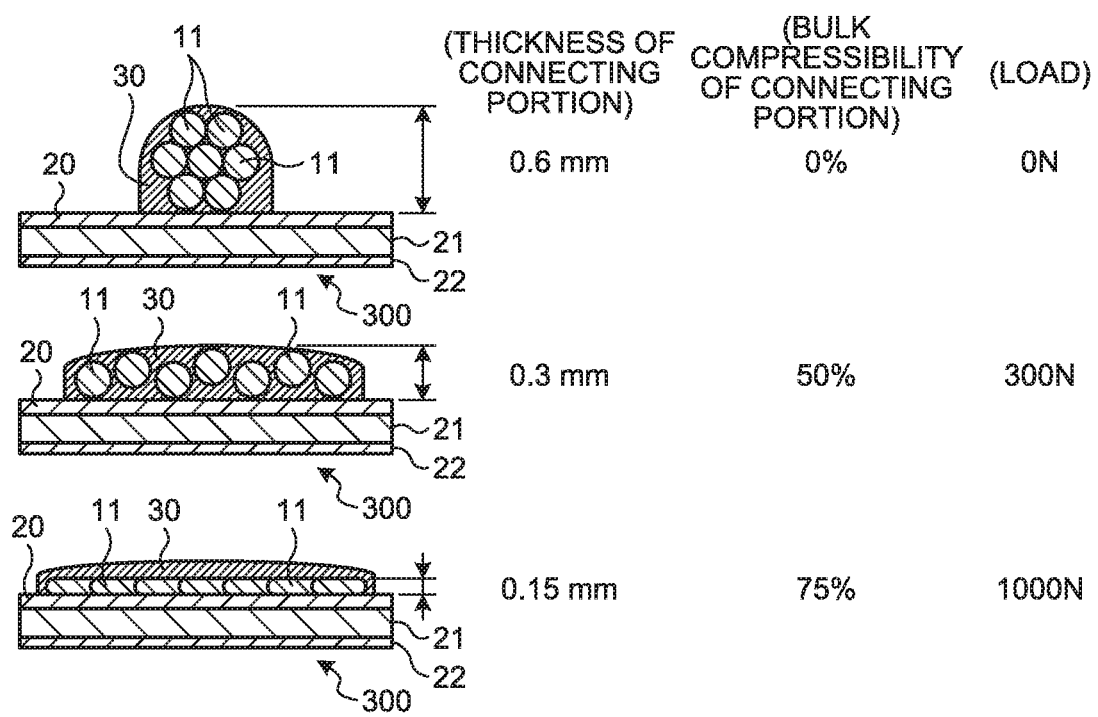
FIG. 4 is a cross-sectional view illustrating variation in the thickness of the inner conductor of the coaxial cable.

Impedance matching of the circuit module 100 according to the present embodiment will be described next. FIG. 4 is a cross-sectional view illustrating variation in the thickness of the inner conductor of the coaxial cable. FIG. 4 illustrates the thickness of the connecting portion 5 and the bulk compressibility of the connecting portion 5 when the load on the dies 40 is 0 N, 300 N, and 1000 N. The connecting portion 5 has a thickness h1 of 0.6 mm when a load on the dies 40 is not applied (0 N), has a thickness h1 of 0.3 mm when the load on the dies 40 is 300 N, and has a thickness h1 of 0.15 mm when the load on the dies 40 is 1000 N.

Here, the non-exposed portion 6 has the same thickness as a connecting portion 5 when a load on the dies 40 is not applied (0 N), that is, the same thickness as the part of the inner conductor 1 which is exposed to the outside. Therefore, the connecting portion 5 has a bulk compressibility of 50% when the load on the dies 40 is 300 N, and its thickness h1 is 50% of the thickness h2 of the non-exposed portion 6. In addition, the connecting portion 5 has a bulk compressibility of 75% when the load on the dies 40 is 1000 N, and its thickness h1 is 25% of the thickness h2 of the non-exposed portion 6.

As illustrated in FIG. 4, some of the plurality of wires 11 constituting the inner conductor 1 are in a state of point contact with the circuit body 20 when the thickness h1 of the connecting portion 5 is 0.6 mm and when the thickness h1 is 0.3 mm. On the other hand, when the thickness h1 of the connecting portion 5 is 0.15 mm, the plurality of wires 11 constituting the inner conductor 1 are deformed and all the wires 11 of the connecting portion 5 are in a state of surface contact with the circuit body 20. That is, as a result of the connecting portion 5 changing from point contact with the circuit body 20 to surface contact therewith, the area of the connecting portion 5 in contact with the circuit body 20 increases. Due to the increase in the area of contact, the resistance between the connecting portion 5 and the circuit body 20 drops.

FIG. 5 is a diagram illustrating the results of measuring the impedance of the circuit module. FIG. 5 illustrates the results of measuring the impedance of the circuit module 100 in which the inner conductor 1 with a connecting portion 5 of each thickness h1 (each bulk compressibility) in FIG. 1 is used. More specifically, the circuit module 100, in which the inner conductor 1 of the coaxial cable 200 is connected to the circuit body 20 of the circuit board 300 via a coaxial cable for measurement (model number; N4419AK20) and an SMA (subminiature type A)-compliant connector, was connected to a port 1 and a port 2 of an N5222B PNA microwave network analyzer (10M to 26.5 GHz), and the impedance was measured using a rise time of 60 ps and a TDR function with a T11 or T22 parameter. As a result, the impedance was 59Ω for a 0% bulk compressibility (thickness h1 of 0.6 mm) of the connecting portion 5, 57Ω for a 50% bulk compressibility (thickness h1 of 0.3 mm) of the connecting portion 5, and 53Ω for a 75% bulk compressibility (thickness h1 of 0.15 mm) of the connecting portion 5. Based on these results, an increase in impedance is suppressed by increasing bulk compressibility. Here, in order to keep any increase in the impedance of the connecting portion 5 of the coaxial cable 200 connected to the circuit body 20 to within ±5% of a reference impedance (50Ω, for example), the bulk compressibility of the connecting portion 5 must be set at 65% or more, based on the results of FIG. 5. Note that the bulk compressibility of the connecting portion 5 is preferably 65% to 75%, which is optimal, due to the concern about the strength degrading when a load acts on the connecting portion in the event of excessive compression. The thickness h1 of the connecting portion 5 when the bulk compressibility of the connecting portion 5 is equal to or more than 65% is equal to or less than 35% of the thickness h2 of the non-exposed portion 6. Furthermore, the thickness h1 of the connecting portion 5 when the bulk compressibility of the connecting portion 5 is set at 75% is 25% of the thickness h2 of the non-exposed portion 6.

Figure 6:
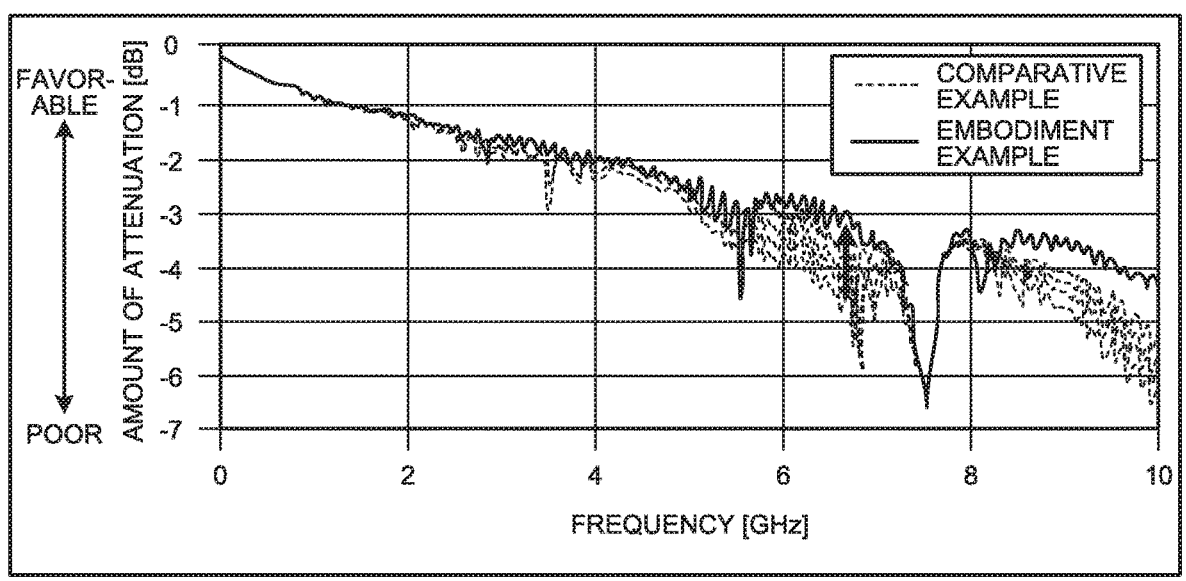
FIG. 6 is a diagram illustrating the results of measuring the frequency and amount of attenuation of the circuit module.

FIG. 6 is a diagram illustrating the results of measuring the frequency and amount of attenuation of the circuit module. FIG. 6 illustrates the results of measuring the frequency-attenuation of the circuit module 100 in which the inner conductor 1 of the coaxial cable 200 is connected to the circuit body 20 of the circuit board 300. More specifically, the circuit module 100, in which the inner conductor 1 of the coaxial cable 200 is connected to the circuit body 20 of the circuit board 300 via a coaxial cable for measurement (model number; N4419AK20) and an SMA (subminiature type A)-compliant connector, was connected to port 1 and port 2 of an N5222B PNA microwave network analyzer (10M to 26.5 GHz), and S21 or S12 parameter was measured. When a comparative example, in which the bulk compressibility of the connecting portion 5 of the coaxial cable 200 is 0%, is compared with an embodiment example in which the connecting portion 5 of the coaxial cable 200 is compressed at a bulk compressibility of 75%, the embodiment example exhibits a minimal amount of attenuation in comparison with the comparative example, and hence the characteristics are improved. The foregoing measurement results indicate an advantageous effect whereby an impedance mismatch can be suppressed even when the inner conductor 1 of the coaxial cable 200, the connecting portion 5 of which has a bulk compressibility of 65% to 75% (the thickness h1 of the connecting portion 5 is 35% to 25% of the thickness h2 of the non-exposed portion 6), is connected directly to the circuit body 20 of the circuit board 300.

As described hereinabove, for the circuit module 100 and the method for manufacturing the circuit module 100 according to the present embodiment, the thickness of the connecting portion 5 is equal to or less than 35% of the thickness of the non-exposed portion 6, and the cross-sectional area of the connecting portion 5 is the same as the cross-sectional area of the non-exposed portion 6, thereby enabling an impedance mismatch to be suppressed without using a component for suppressing the impedance mismatch.

Note that, although a stranded cable made by twisting together seven wires 11 is used as the inner conductor 1 in the foregoing embodiments, a single wire could also be used.

The circuit module and the method for manufacturing the circuit module according to the present embodiment affords the advantageous effect of enabling as impedance mismatch to be suppressed even when a coaxial cable is directly connected to a circuit board.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A circuit module in which an inner conductor of a coaxial cable is connected by means of a solder to a circuit body of a circuit board,
    the circuit board comprising:
    a dielectric body;
    the circuit body formed on a surface of the dielectric body; and
    a ground body formed on a back face of the dielectric body, and
    the coaxial cable comprising:
    the inner conductor;
    an insulator provided to surround the inner conductor;
    an outer conductor provided to surround the insulator; and
    a sheath provided to surround the outer conductor, wherein
    the inner conductor has a connecting portion connected to the circuit body, and a non-exposed portion inside the sheath, and
    a thickness of the connecting portion is equal to or less than 35% of a thickness of the non-exposed portion and the cross-sectional area of the connecting portion is the same as the cross-sectional area of the non-exposed portion.

2. The circuit module according to claim 1, wherein the thickness of the connecting portion is 25% to 35% of the thickness of the non-exposed portion.

3. The circuit module according to claim 1, wherein a width of the connecting portion is larger than a width of the non-exposed portion.

4. The circuit module according to claim 2, wherein a width of the connecting portion is larger than a width of the non-exposed portion.

5. The circuit module according to claim 1, wherein the outer conductor is connected to the ground body.

6. The circuit module according to claim 2, wherein the outer conductor is connected to the ground body.

7. The circuit module according to claim 3, wherein the outer conductor is connected to the ground body.

8. The circuit module according to claim 4, wherein the outer conductor is connected to the ground body.

9. A method for manufacturing a circuit module in which an inner conductor of a coaxial cable is connected by means of a solder to a circuit body of a circuit board,
    the circuit board including:
    a dielectric body,
    the circuit body formed on a surface of the dielectric body, and
    a ground body formed on a back face of the dielectric body,
    the coaxial cable including:
    the inner conductor,
    an insulator provided to surround the inner conductor,
    an outer conductor provided to surround the insulator, and
    a sheath provided to surround the outer conductor, and
    the inner conductor having a connecting portion connected to the circuit body, and a non-exposed portion inside the sheath,
    the method comprising:
    an exposure step in which the insulator, the outer conductor and the sheath of the coaxial cable are stripped away to expose the connecting portion to the outside;
    a compression step in which compression is performed to render a thickness of the connecting portion equal to or less than 35% of a thickness of the non-exposed portion and to make the cross-sectional area of the connecting portion the same as the cross-sectional area of the non-exposed portion; and
    a connection step in which the connecting portion is connected by means of the solder to the circuit body.

10. The circuit module according to claim 1, wherein the inner conductor is constituted by a plurality of wires, the plurality of wires are deformed and all the wires of the connecting portion are in a state of surface contact with the circuit body.

* * * * *